(12) United States Patent
Bal

(10) Patent No.: US 6,748,577 B2
(45) Date of Patent: Jun. 8, 2004

(54) SYSTEM FOR SIMPLIFYING THE PROGRAMMABLE MEMORY TO LOGIC INTERFACE IN FPGA

(75) Inventor: Ankur Bal, Ghaziabad (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 10/186,314

(22) Filed: Jun. 28, 2002

(65) Prior Publication Data

US 2003/0005402 A1 Jan. 2, 2003

(30) Foreign Application Priority Data

Jun. 29, 2001 (IN) ........................................ 729/Del/2001

(51) Int. Cl.⁷ ............................................ G06F 17/50
(52) U.S. Cl. .............................. 716/16; 716/14; 716/15
(58) Field of Search ................. 716/12–16; 326/39–41; 711/104–106; 365/218, 230.05

(56) References Cited

U.S. PATENT DOCUMENTS

| | | | | |
|---|---|---|---|---|
| 5,566,123 A | * | 10/1996 | Freidin et al. | 365/230.05 |
| 5,784,327 A | * | 7/1998 | Hazani | 365/218 |
| 5,804,986 A | * | 9/1998 | Jones | 326/40 |
| 5,933,023 A | | 8/1999 | Young | 326/40 |
| 6,127,843 A | * | 10/2000 | Agrawal et al. | 326/40 |
| 6,184,707 B1 | * | 2/2001 | Norman et al. | 326/39 |
| 6,184,713 B1 | * | 2/2001 | Agrawal et al. | 326/41 |
| 6,429,682 B1 | * | 8/2002 | Schultz et al. | 326/41 |
| 6,467,017 B1 | * | 10/2002 | Ngai et al. | 711/104 |

OTHER PUBLICATIONS

Hisano, S.; Brokaw, A.P.; Granoff, N.R.; A complete single supply dual 18–bit audio DAC Consumer Electronics, IEEE Transactions on, vol.: 37, Issue: 3, Aug. 1991 pp.: 697–701.*

A. Cremonesi, et al., "An 8–bit Two–Step Flash A/D Converter for Video Application", IEEE Digest of CICC, pp. 6.3.1–6.3.4.*

Kawana, K. et al., "An Efficient Logic Block Interconnect Architecture for User–Reprogrammable Gate Array," IEEE 1990 Custo Integrated Circuits Conf., May 1990, CH2860–5/90/0000–0164, pp. 31.3.1 to 31.3.4.*

Levitt, K.; Kautz, W.;Cellular arrays for the parallel implementation of binary error–correcting codes Information Theory, IEEE Transactions on, vol.: 15, Issue: 5, Sep. 1969.pp.: 597–607.*

Satoh, H. et al., "A 209–K–Transitor ECL Gate Array with RAM," IEEE Jor. Solid–State Circuits, vol. 24, No. 5, Oct. 1989, pp. 1275–1279.*

T.C. Ong, et al., "The EEPROM as an Analog Memory Device", IEEE Trans. On. Electron Devices, vol. 36, No. 9, Sep. 1989.*

* cited by examiner

Primary Examiner—Vuthe Siek
Assistant Examiner—Naum Levin
(74) Attorney, Agent, or Firm—Lisa K. Jorgenson; Allen, Dyer, Doppelt, Milbrath & Gilchrist, P.A.

(57) ABSTRACT

A system for simplifying the programmable memory-to-logic interface in field programmable gate arrays (FPGAs) is provided. An interface may be used to isolate the general purpose routing architecture for intra-programmable logic blocks (PLBs) from the random access memory (RAM) address lines, data lines, and control lines. The PLBs and the input-output resources of the FPGA access the embedded memory (or RAM) using dedicated direct interconnects. Certain of these direct interconnects may originate from PLBs in the vicinity of the RAM. The remainder run between the input-output (IO) pads/routing and the RAM blocks. A bus routing architecture is also provided to combine the memories to emulate larger RAM blocks. This bus routing provides interconnection among RAM blocks and is isolated from the PLB routing resources.

38 Claims, 5 Drawing Sheets

= PLB, LUT or IO PAD/ROUTING

SYSTEM FOR SIMPLIFYING THE PROGRAMMABLE MEMORY TO LOGIC INTERFACE IN FPGA

FIELD OF THE INVENTION

This invention relates to the field of memory devices, and, more particularly, to a system for simplifying the programmable memory-to-logic interface in field programmable gate arrays (FPGAs).

BACKGROUND OF THE INVENTION

An FPGA is a semi-custom device including an array of generic cells or logic blocks each having a programmable function and which are surrounded by a programmable interconnect network. Inclusion of RAM blocks in the FPGA architecture saves valuable logic and routing resources. Memory intensive applications are accommodated within an FPGA with embedded RAM blocks. Also, many wide input/output functions may be handled by the RAM blocks, thus saving logic and interconnect resources.

Such RAM blocks are generally evenly distributed on the FPGA chip. An interconnect system is provided for the RAM to interface with other logic resources on chip. In U.S. Pat. No. 5,933,023 assigned to Xilinx, Inc., routing lines which access the logic blocks also access address, data, and control lines of the RAM blocks. This results in some routing flexibility between the RAM and other logic blocks, but at the same time offers a very complex model for the software tool. A number of constraints such as intra-bus net slack, general routing asymmetry, routing congestion, etc., may thus result.

SUMMARY OF THE INVENTION

The present invention provides a system for simplifying the interface between the embedded memory and the programmable logic blocks and input/output resources in an FPGA. The system may include an interface to isolate the general purpose routing architecture, or intra-programmable logic block (PLB) routing, from memory address lines, data lines, and control lines. Further, direct interconnects may be included for connecting the PLBs and input-output (IO) resources of the FPGA to the embedded memory or RAM.

The direct interconnects connect the input pins of the memory to outputs nearby of PLBs, and the output pins of the memory are directly connected to the inputs of PLBs in the vicinity thereof. The direct interconnects to/from the memory are not a part of the general routing resources of the FPGA. As such, they do not hamper the symmetric routing fabric or lines for the logic resources or the PLBs.

The memory may have a plurality of multiplexers and de-multiplexers connected to its input and output pins, respectively. The inputs to the multiplexers may be output from various PLBs, the same PLB, or from IO pads. Further, the outputs from the de-multiplexers are connected to the PLB inputs or IO resources. Further, the PLBs interact with the memory through programmable tappings or switches which provide the interface.

The above system may further include devoted bus-based routing for connecting data and address lines to combine the memory blocks and implement larger memories. This reduces configuration register/flip-flop count with respect to a net-to-net route. The registers internal to the memory blocks may be eliminated by utilizing the registers/flip-flops of the PLBs for latching signals sent to or received from the memory, thereby saving significant chip area.

The registers internal to the memory may include input registers, output registers, or both. The internal registers/flip-flops of the PLBs may also receive inputs from the general purpose routing. The internal elements of the PLBs may include a look up table (LUT), and an internal flip-flop may also be used for other functionality independent of the memory interface. The registers/flip-flops are selectively bypassed for the case when unregistered memory inputs and outputs are required. The memory may be ROM or RAM, for example.

The connectivity of the PLBs and IO resources with the general purpose routing architecture coexists with the interface to the embedded memory. The output registers internal to the memory blocks may be eliminated by utilizing the registers of the PLBs for latching the output data from the memory, thereby saving significant chip area.

The present invention further provides a method for simplifying the interface between the embedded memory and the programmable logic blocks and input output resources in an FPGA. The method may include isolating the general purpose routing architecture (or intra-PLB routing) from memory address lines, data lines, and control lines. The method may further include connecting the PLBs and IO resources of the FPGA to the embedded memory (or memories) using multiple dedicated direct interconnects.

More particularly, the method may also include connecting, via direct interconnects, the input pins of the memory to outputs of PLBs in the vicinity of the memory blocks. Further, output pins of the memory are directly connected to the inputs of PLBs in the vicinity thereof. It should be noted that the direct interconnects are not a part of the general routing resources of the FPGA and, thus, do not hamper the symmetric routing for the logic resources or the programmable logic blocks (PLBs).

The above method may be particularly applicable to a single port memory including a plurality of multiplexers and de-multiplexers connected to the input and output pins thereof, respectively. In such case, the method may include connecting inputs to the multiplexer to outputs from multiple PLBs, a same PLB, or input-output (IO) pads/routing. The method may further include connecting outputs from the de-multiplexer to PLB inputs or IO resources.

The above method thus allows for the restriction of interaction between the PLBs and memory through programmable devices. The above method may further include devoted bus-based routing for connecting data and address lines to combine the memory blocks and, thus, implement larger memories. Again, this reduces configuration register/flip-flop count with respect to a net-to-net route.

The registers internal to the memory blocks present in prior art devices may be eliminated by utilizing the registers/flip-flops of the PLBs for latching signals sent to or received from the memory, thus saving significant chip area. The registers internal to the memory may include input registers, output registers, or both. The internal registers/flip-flops of the PLBs may also receive inputs from the general purpose routing.

The internal elements of the PLBs including the LUT and the internal flip-flop may also be used for other functionality independently of the memory interface. The method may also include selectively bypassing the registers/flip-flops for the case when unregistered memory outputs are required. The memory may be ROM or RAM, for example.

The connection of the PLBs and IO resources to the general purpose routing architecture coexists with the interface to the embedded memory. The output registers internal to the memory blocks may be eliminated by utilizing the registers of the PLBs for latching the output data from the memory, thus saving significant chip area.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
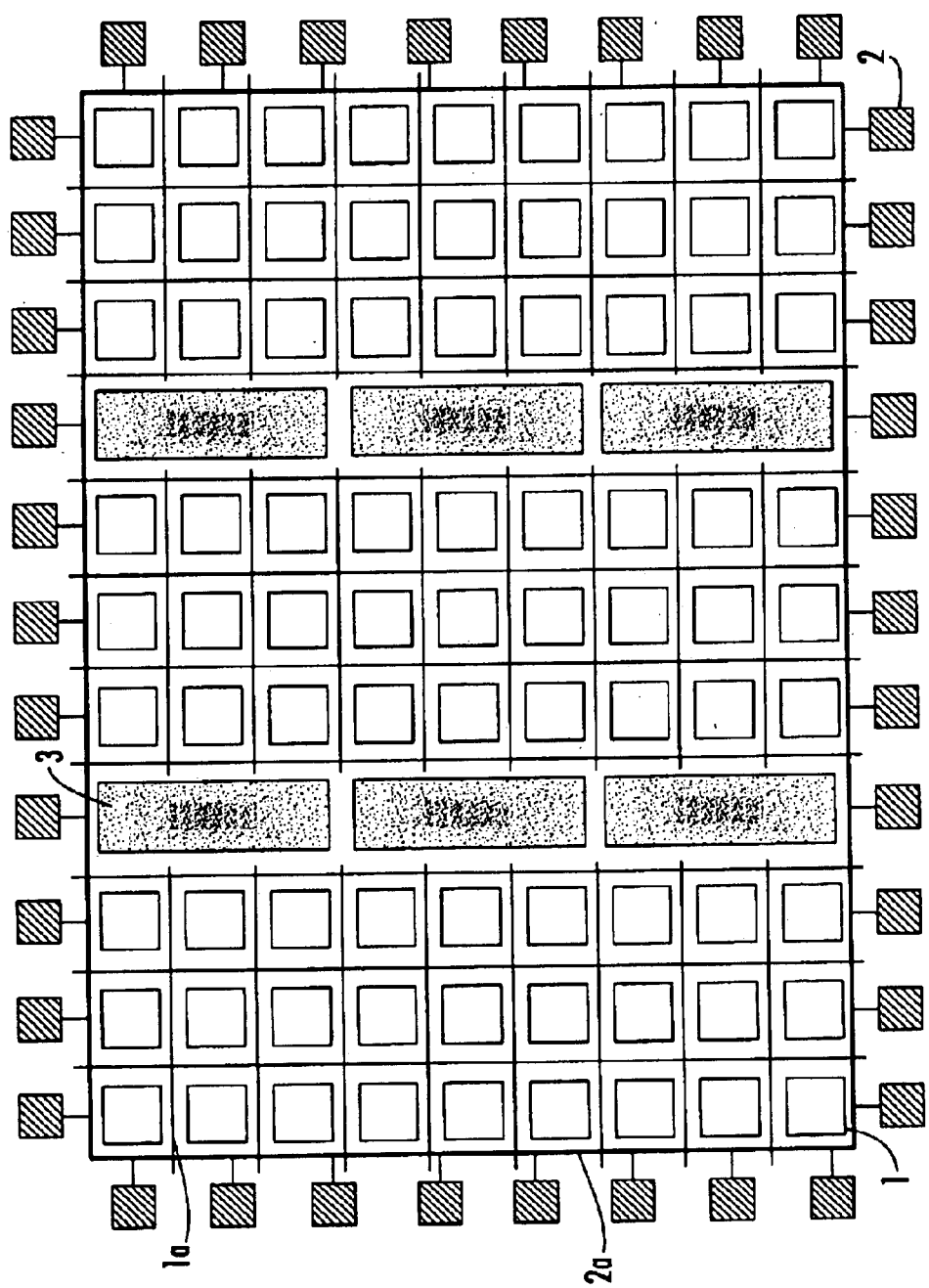
FIG. 1 is a schematic block diagram of an FPGA chip including embedded memory RAM according to the prior art.
Figure 2:
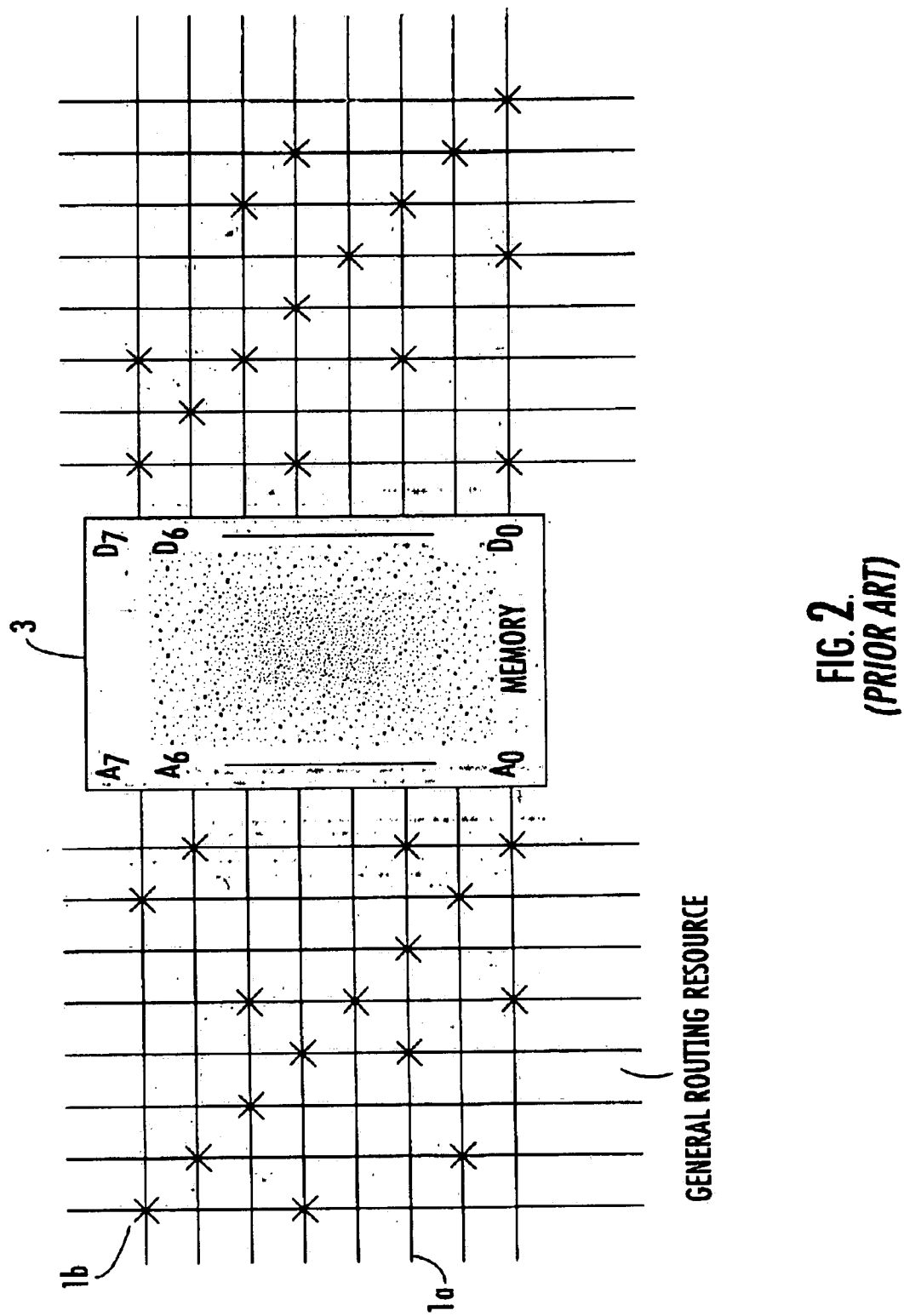
FIG. 2 is a schematic diagram illustrating an interconnection scheme of the prior art for a rudimentary single port RAM.

An FPGA chip with embedded memory (RAM) 3 in accordance with the prior art is illustrated in FIG. 1. The FPGA chip includes a generic programmable logic block (PLB) 1, general routing fabric 1a, input-output (IO) routing resources 2a, and IO pads 2. The interconnect scheme of the prior art for a rudimentary single port RAM is shown in FIG. 2. Configurable switches 1b interface the memory 3 to the routing interconnects 1a in the routing channel. These routing lines can also be accessed by logic blocks or IO pads through the routing channel. Thus, a certain amount of flexibility is provided by such prior art architecture. Yet, many constraints are consequently introduced, and the software for routing such architectures becomes very complex as the memory (RAM) blocks in the FPGA chip are augmented.

Figure 3:
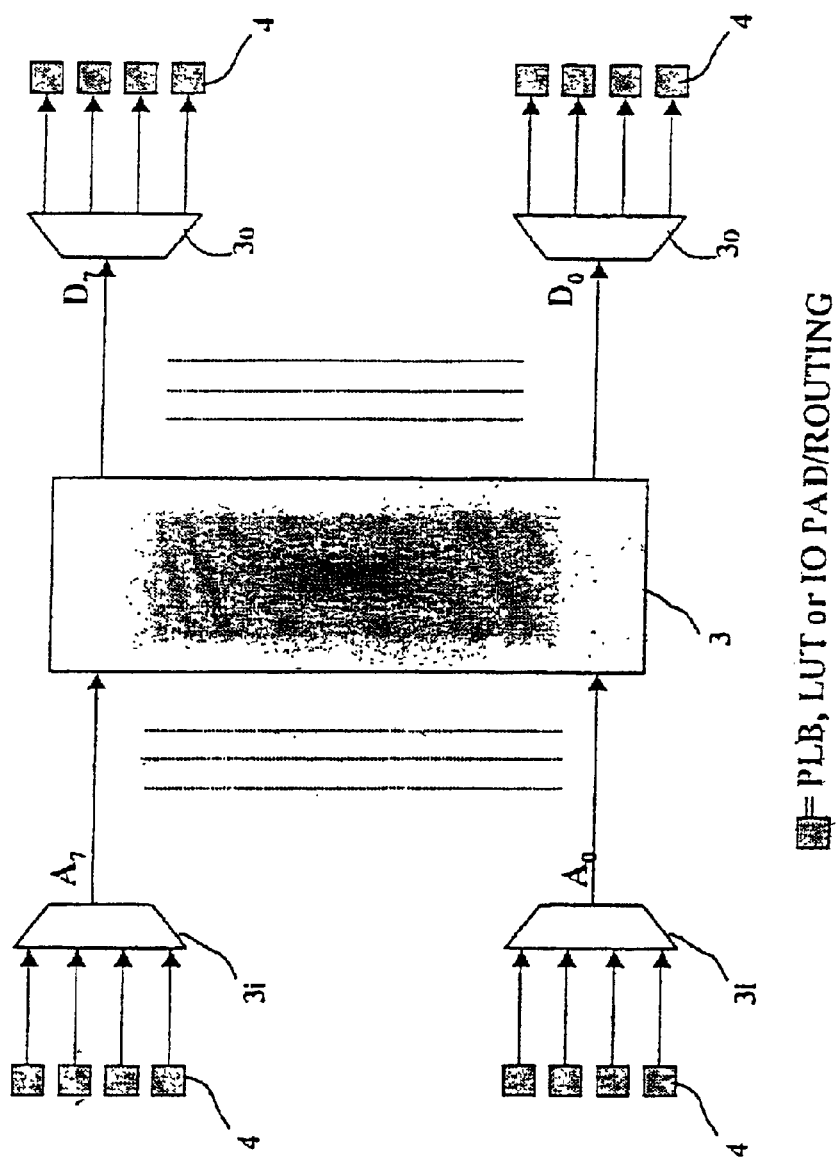
FIG. 3 is a schematic diagram of a single port memory in accordance with the invention including a plurality of multiplexers and de-multiplexers connected to its input and output pins, respectively.

The embodiment shown in FIG. 3 illustrates several advantages provided by the present invention. Here, a simple, single port memory is shown with a plurality of multiplexers 3i and de-multiplexers 3o at its input and output pins, respectively. The RAM 3 has eight address inputs and eight data outputs. The inputs to the multiplexers 3i are outputs from various PLBs (or even the same PLB), or from IO pads/routing. Similarly, outputs from the de-multiplexers 3o are fed to PLB inputs or IO resources.

The multiplexers 3i and de-multiplexers 3o will typically be configured during initial configuration of the device. In most cases, all of the multiplexers 3i and de-multiplexers 3o can share their respective configuration bits, thus reducing the configuration latch count. The direct interconnects to/from IO routing at the device periphery may be provided to facilitate signals from numerous IO pads, rather than a single pad.

Therefore, by using programmable, direct interconnects for the memory interface, many advantages result. Several of these advantages are discussed below. It should be noted that in accordance with the present invention PLBs which interact with the RAM do so only through programmable switches providing connections to/from their inputs or outputs. Their connectivity to the general-purpose routing fabric is not altered in any way.

The basic idea of extending direct interconnects from PLBs or IOs is to spare the general purpose routing lines the burden of RAM interconnects. The memory block will network signals to/from either a sub-circuit or an IO resource. The invention thus may be used to reduce routing lines required to convey signals between sub-circuits/IOs and the memory. The same arguments hold true for control signals to/from the memory. Although some limitations are inherent in terms of flexibility when direct interconnects are used for memory interface, the architecture becomes more "software friendly," as will be appreciated by those of skill in the art.

Figure 4:
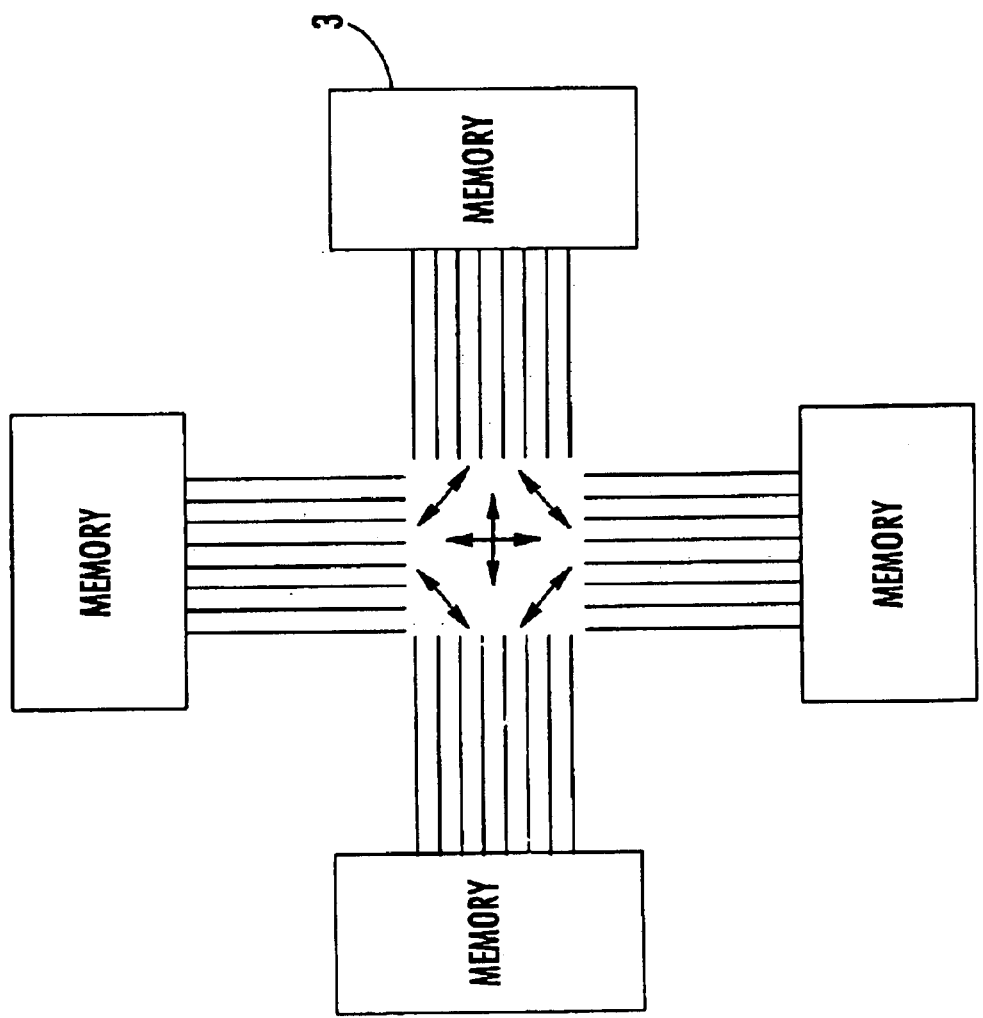
FIG. 4 is a schematic block diagram illustrating devoted bus-based routing for connecting data and address lines to combine RAM blocks and thus implement larger memories in accordance with the invention.

Another aspect of the invention is to provide dedicated bus-based routing for interconnecting data and address lines to combine the RAM blocks and implement larger memories (FIG. 4). This dedicated routing extends between memory address ports or data ports that might be combined for large memory emulation. As the routing is bus-based, configuration latch count is reduced because a bus is routed as a whole against a net-to-net route. To combine the memories 3 as shown in FIG. 4, the dedicated memory address bus routing has six configuration latches at every junction (independent of the data bus width), as illustratively shown.

Figure 5:
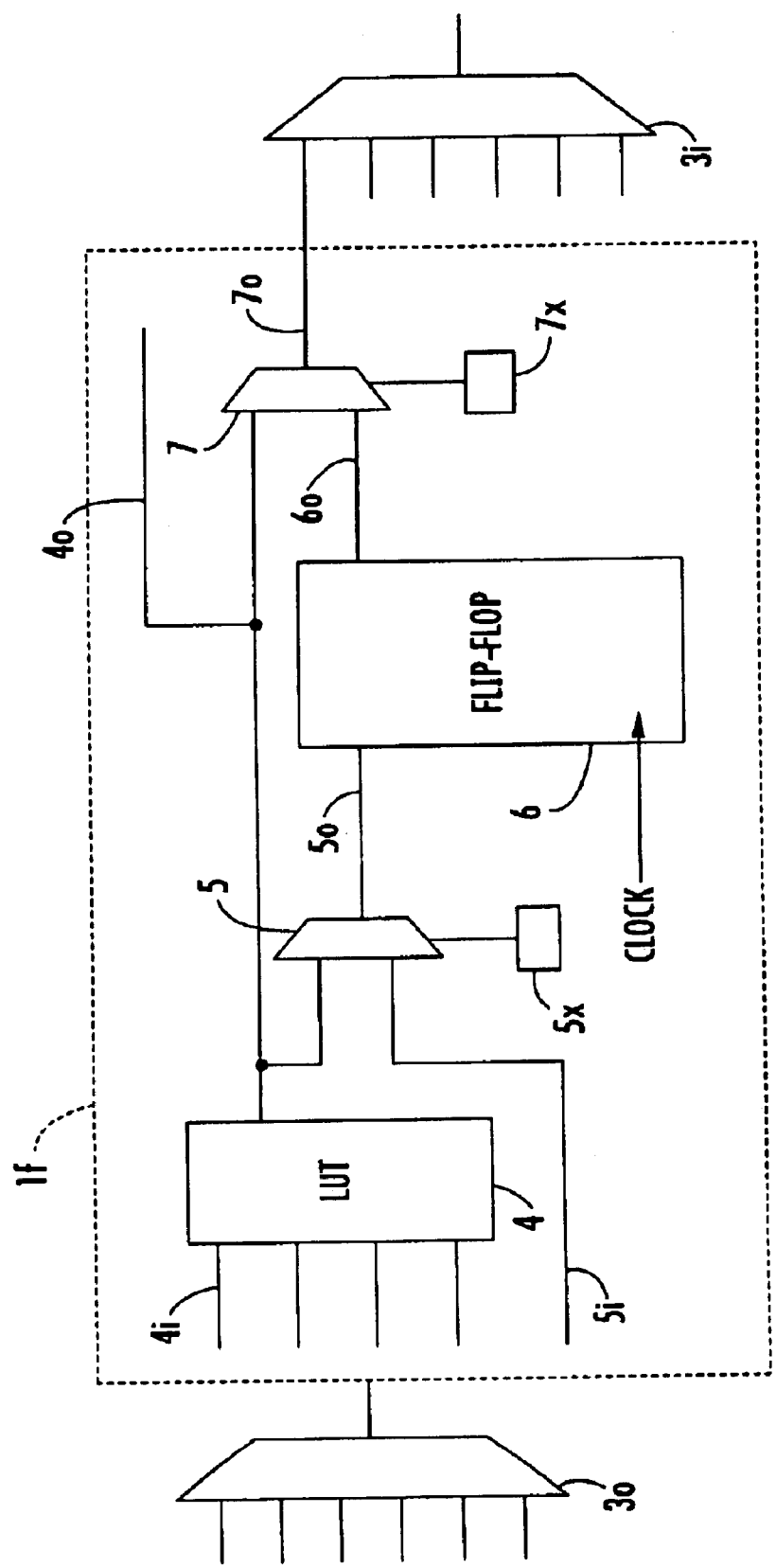
FIG. 5 is a schematic block diagram of the internal circuitry of a memory illustrating the elimination of the internal registers thereof in accordance with the present invention to provide area savings.

Referring to FIG. 5, the multiplexer 3i sourcing a memory input is shown connected to the PLB output via a direct interconnect (DI) 7o. The memory block can be used in both synchronous and asynchronous mode. The asynchronous mode is used when the memory block is used to implement combinatorial logic. In this mode, the memory block receives unregistered output 4o of the LUT via multiplexer 7. The memory output is directed through the multiplexer 3o to the PLB input 4i, which is an LUT input. The control line of the multiplexers is suitably configured by the configuration latches 5x and 7x.

In the synchronous mode, the memory block is used as a RAM. In this mode, the registered output 6o of the LUT is connected to the memory input via the multiplexers 7 and 3i. The control line of the multiplexer is suitably configured by the configuration latch 7x to include the flip-flop output. Another possibility is to connect the flip-flop input to the line 5i via the multiplexer 5. This enables the memory input signal to bypass the LUT output and approach the flip-flop from general purpose routing. The flip-flop associated with each LUT reduces the need for internal memory registers present at the input of a conventional memory block. The clock of the flip-flop initiates the read/write operation of the memory.

Similarly, the output registers of the memory become redundant as the multiplexer 3o may drive a PLB input 5i. The output of the multiplexer 3o is directed to the flip-flop 6 via the multiplexer 5. Thus, memory registers may be saved using the memory blocks. It should also be noted that if the flip-flop is used as a memory input/output register, the LUT may be used to perform independently.

Various advantages provided in accordance with the invention will be apparent to those skilled in the art in light of the foregoing description. In particular, architecture is simplified, as switch pattern interfaces between general routing and the memories may be eliminated. Further, input/output registers internal to a memory may be eliminated, and symmetric properties of the general purpose routing may be preserved.

Moreover, memory routing may be independent of PLB routing architecture and is bus-based. This results in a symmetrical PLB routing architecture. Configuration latch count in intra-memory routing is also reduced with the additional advantage of improved flexibility with respect to tying up memories.

Further advantages include the fact that there is no "slack" among nets forming the address/data bus. Negligible slack that might be introduced while combining memories can be easily controlled. Also, the present invention facilitates even distribution of memory resources in the FPGA without increasing complexity, and it reduces the formidable task of routing memories to PLBs for the place and route tool. Thus, it simplifies the requisite algorithms and the time and complexity associated with the routing tool.

That which is claimed is:

1. A programmable a gate array (PGA) comprising:
    at least one embedded memory having a plurality of address lines, data lines, and control lines connected thereto;
    a plurality of programmable logic blocks (PLBs);
    a plurality of input/outputs (I/Os);
    a plurality of routing lines interconnecting said at least one embedded memory, said PLBs, and said I/Os;
    an interface for isolating the routing lines from said address lines, data lines, and control lines; and
    a plurality of dedicated connections for connecting said PLBs and said I/Os to said at least one embedded memory.

2. The PGA of claim 1 wherein said at least one embedded memory further comprises input and output terminals; and wherein said dedicated connections connect PLBs adjacent respective input terminals thereto, and connect PLBs adjacent respective output terminals thereto.

3. The PGA of claim 1 wherein said at least one embedded memory further comprises input and output terminals; and further comprising at least one multiplexer connected to said input terminals, and at least one de-multiplexer connected to said output terminals.

4. The PGA of claim 3 wherein said at least one multiplexer is connected to at least one of said PLBs.

5. The PGA of claim 3 wherein said at least one multiplexer is connected to at least one of said I/Os.

6. The PGA of claim 3 wherein said at least one de-multiplexer is connected to at least one of said PLBs.

7. The PGA of claim 3 wherein said at least one de-multiplexer is connected to at least one of said I/Os.

8. The PGA of claim 1 wherein said interface comprises a plurality of programmable switches.

9. The PGA of claim 1 wherein said at least one embedded memory comprises a plurality of embedded memories; and further comprising at least one bus for interconnecting data and address lines of said plurality of embedded memories to provide a memory of increased size.

10. The PGA of claim 1 wherein said PLBs comprise at least one internal register for latching signals sent to or received from said at least one embedded memory.

11. The PGA of claim 10 wherein said at least one internal register comprises at least one of an internal input register and an internal output register.

12. The PGA of claim 10 wherein said internal registers of said PLBs are connected to said routing lines.

13. The PGA of claim 10 wherein said internal registers of said PLBs are selectively bypassable to provide unregistered memory inputs and outputs.

14. The PGA of claim 1 wherein each PLB comprises at least one internal flip-flop for latching signals sent to or received from said at least one embedded memory.

15. The PGA of claim 1 wherein said PLBs comprise a look-up table (LUT) and a flip-flop connected thereto for interfacing said at least one embedded memory, and wherein said LUT is used at least independently of said flip-flop.

16. The PGA of claim 1 wherein said at least one embedded memory comprises at least one of a read only memory (ROM) and a random access memory (RAM).

17. The PGA of claim 1 wherein said at least one embedded memory comprises at least one single-port embedded memory.

18. A field programmable gate array (FPGA) comprising:
    a plurality of embedded memories having a plurality of address lines, data lines, and control lines connected thereto;
    a plurality of programmable logic blocks (PLBs);
    a plurality of input/output (I/Os);
    a plurality of routing lines interconnecting said embedded memories, said PLBs, and said I/Os;
    a plurality of programmable switches for isolating the routing lines from said address lines, data lines, and control lines; and
    a plurality of dedicated connections for connecting said PLBs and said I/Os to said embedded memories.

19. The FPGA of claim 18 wherein said embedded memories comprise input and output terminals; and wherein said dedicated connections connect PLBs adjacent respective input terminals thereto, and connect PLBs adjacent respective output terminals thereto.

20. The FPGA of claim 18 wherein said embedded memories further comprise input and output terminals; and further comprising at least one respective multiplexer connected to said input terminals of each embedded memory, and at least one respective de-multiplexer connected to said output terminals of each embedded memory.

21. The FPGA of claim 18 further comprising at least one bus for interconnecting data and address lines of said plurality of embedded memories to provide a memory of increased size.

22. The FPGA of claim 18 wherein said PLBs comprise at least one internal register for latching signals sent to or received from said embedded memories.

23. The FPGA of claim 22 wherein said internal register of said PLBs are connected to said routing lines.

24. The FPGA of claim 22 wherein said internal registers of said PLBs are selectively bypassable to provide unregistered memory inputs and outputs.

25. The FPGA of claim 18 wherein each PLB comprises a look-up table (LUT) and a flip-flop connected thereto for interfacing said embedded memories; and wherein said LUT is used at least independently of said flip-flop.

26. A method for making a programmable gate array (PGA) Comprising:
    providing at least one embedded memory and connecting a plurality of address lines, data lines, and control lines thereto;
    providing a plurality of programmable logic blocks (PLBs) and a plurality of input/outputs (I/Os);
    interconnecting the at least one embedded memory, the PLBs, and the I/Os using a plurality of routing lines;
    isolating the routing lines from the memory address lines, data lines, and control lines; and
    connecting the PLBs and the I/Os to the at least one embedded memory using dedicated connections.

27. The method of claim 26 wherein the at least one embedded memory further comprises input and output terminals; and wherein the dedicated connections connect PLBs adjacent respective input terminals thereto, and connect PLBs adjacent respective output terminals thereto.

28. The method of claim 26 wherein the at least one embedded memory further comprises input and output terminals; and further comprising connecting at least one multiplexer to the input terminals and at least one de-multiplexer to the output terminals.

29. The method of claim 28 further comprising connecting the at least one multiplexer to at least one of the PLBs.

30. The method of claim 28 further comprising connecting the at least one multiplexer to at least one of the I/Os.

31. The method of claim 28 further comprising connecting the at least one de-multiplexer to at least one of the PLBs.

32. The method of claim 28 further comprising connecting the at least one de-multiplexer to at lease one of the I/Os.

33. The method of claim 26 wherein isolating comprises isolating the routing lines from the address lines, data lines, and control lines using a plurality of programmable switches.

34. The method of claim 26 wherein the at least one embedded memory comprises a plurality of embedded memories; and further comprising interconnecting data and address lines of the plurality of embedded memories to provide a memory of increased size using at least one bus.

35. The method of claim 26 wherein the PLBs comprise at least one internal register for latching signals sent to or received from the at least one embedded memory.

36. The method of claim 35 further comprising connecting the internal registers of the PLBs to the routing lines.

37. The method of claim 26 wherein the PLBs comprise at least one internal flip-flop for latching signals sent to or received from the at least and embedded memory.

38. The method of claim 26 wherein the PLBs comprise a look-up table (LUT) and a flip-flop connected thereto for interfacing the at least one embedded memory; and wherein the LUT is used at least independently of the flip-flop.

* * * * *

UNITED STATES PATENT AND TRADEMARK OFFICE
CERTIFICATE OF CORRECTION

PATENT NO. : 6,748,577 B2
DATED : June 8, 2004
INVENTOR(S) : Ankur Bal

It is certified that error appears in the above-identified patent and that said Letters Patent is hereby corrected as shown below:

Column 5,
Line 15, delete "programmable a gate" insert -- programmable gate --

Column 6,
Line 53, delete "Comprising" insert -- comprising --

Column 8,
Line 13, delete "at least and" insert -- at least one --

Signed and Sealed this

Eighth Day of February, 2005

JON W. DUDAS
*Director of the United States Patent and Trademark Office*